United States Patent
Yasui

(10) Patent No.: US 8,074,134 B2
(45) Date of Patent: Dec. 6, 2011

(54) PATTERN GENERATOR AND MEMORY TESTING DEVICE USING THE SAME

(75) Inventor: Takahiro Yasui, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/991,876

(22) PCT Filed: May 21, 2008

(86) PCT No.: PCT/JP2008/001273
§ 371 (c)(1), (2), (4) Date: Feb. 1, 2011

(87) PCT Pub. No.: WO2009/141848
PCT Pub. Date: Nov. 26, 2009

(65) Prior Publication Data
US 2011/0119539 A1 May 19, 2011

(51) Int. Cl.
*G06F 11/00* (2006.01)
(52) U.S. Cl. .................. 714/738
(58) Field of Classification Search ........... 714/71, 714/720, 724–725, 733–734, 738–739; 365/200–201
See application file for complete search history.

(56) References Cited

U.S. PATENT DOCUMENTS

| 4,958,346 A * | 9/1990 | Fujisaki | 714/720 |
| 6,285,962 B1 * | 9/2001 | Hunter | 702/117 |
| 6,363,022 B2 * | 3/2002 | Tsuto | 365/201 |
| 6,834,361 B2 * | 12/2004 | Abbott | 714/42 |

FOREIGN PATENT DOCUMENTS

| JP | 52-063632 | 5/1977 |
| JP | 04-62646 | 2/1992 |
| JP | 05-053550 | 3/1993 |

* cited by examiner

*Primary Examiner* — Shelly A Chase
(74) *Attorney, Agent, or Firm* — Ladas & Parry, LLP

(57) ABSTRACT

An address operation circuit generates a row address which indicates an address in memory under test to be accessed. The row address memory stores the row addresses generated by the address operation circuit in increments of banks. A memory control signal that includes a bank address to be applied to the memory under test, and which is generated according to a pattern program, is used as a save address to be used to write the row address to the row address memory, and as a load address to be used to read out the row address from the row address memory.

10 Claims, 2 Drawing Sheets

PATTERN GENERATOR AND MEMORY TESTING DEVICE USING THE SAME

BACKGROUND OF THE INVENTION

Cross Reference to Related Applications

This application is the U.S. National Stage of International Patent Application No. PCT/JP2008/001273 filed on May 21, 2008 and claims priority thereto, the disclosure of which is hereby incorporated by reference in its entirety.

1. Field of the Invention

The present invention relates to a pattern generator employed in a memory test apparatus.

2. Description of the Related Art

As a main storage device included in an electronic computer such as a personal computer, a workstation, etc., DRAM (Dynamic Random Access Memory) having a multi-bank configuration is employed. With such multi-bank configuration DRAM, by sequentially transmitting data to/from each bank of the memory with low latency in a seamless manner, such an arrangement provides high-speed data transmission. When such multi-bank configuration DRAM is accessed, the bank address that designates the target bank and the row address that is designated for each bank must be applied to the memory, after which the column address must be applied to the memory, in order to identify the target cell for which data access such as data reading, data writing, etc. is to be performed.

In a case of testing such multi-bank configuration memory, it leads to the following situation. That is to say, in order to access the memory, a corresponding row address is applied to each bank while sequentially switching banks. Subsequently, after returning to the initial bank, the same row address as that in the previous memory access operation is applied to each bank again while switching the multiple banks in the same way, so as to perform the next memory access operation.

With such a test apparatus, the row address is generated by means of a pattern generator. However, an operation in which the same row address is repeatedly generated is wasteful.

Furthermore, in a case in which memory configured to support burst transmission is tested, during a period in which a burst read operation or a burst write operation is executed for a given bank, there is a need to access a different bank. Such an arrangement requires two different row addresses at the same time.

In order to solve such a problem, a technique has been proposed in which an address save/load circuit is employed in a pattern generator. The address save/load circuit saves, in memory (which will be referred to as the "row address memory"), the row addresses which were each applied to a corresponding bank. Subsequently, before the same address of the same bank is accessed in the next operation, the same address thus saved is loaded and used.

Related Patent Documents

Japanese Patent Application Laid Open No. 2000-123597
International Publication WO 2004/113941 pamphlet In a case in which memory under test is tested using a test apparatus having such an address save/load function, the user must perform programming of a pattern program that corresponds to the content of the test. The user must save each row address in row address memory included in the address save/load circuit. Furthermore, the user must generate an address used to load the row address thus stored, in addition to the address to be applied to the memory under test. That is to say, there is a need to design a pattern program including a function of generating an address which does not directly relate to the access operation for the memory under test. This leads to a problem of complicated programming, which is troublesome.

SUMMARY OF THE INVENTION

The present invention has been made in view of such problems. Accordingly, it is a general purpose of the present invention to provide a pattern generator which can be controlled according to a pattern program having a simpler configuration than that of conventional arrangements.

An embodiment of the present invention relates to a pattern generator employed in a test apparatus configured to test memory under test having a multi-bank configuration. The pattern generator comprises: an address operation circuit configured to generate a row address which indicates an address in the memory under test to be accessed; and row address memory configured to store the row addresses generated by the address operation circuit in increments of banks. The pattern generator uses a memory control signal which includes a bank address to be applied to the memory under test, and which is generated according to a program, as a save address used to write the row address to the row address memory, and as a load address used to read out the row address from the row address memory.

With such an embodiment, the bank address is used as an address signal used to access the row address memory. Thus, there is no need to code a function for generating an address signal for the row address memory according to the pattern program. This provides simplified programming, thereby reducing the burden on the user of the test apparatus.

Also, a pattern generator according to an embodiment may further comprise an output holding circuit configured to receive a control signal generated according to the program in order to set a burst length used on accessing the memory, and to hold the row address read out from the row address memory during a period that corresponds to the burst length.

With such an embodiment, before the burst transmission is started, the row address is read out from the row address memory according to the load command. After this operation, the output holding circuit holds the row address for the period of a required number of cycles. Thus, there is no need to code a load command for each cycle in the pattern program, thereby further reducing the programming burden.

Also, the address operation circuit may be configured so as to be capable of generating a save address and a load address to be used for the row address memory, in addition to the row address. Also, the pattern generator may further comprise: a write address setting unit configured to select one from among the memory control signal and the save address generated by the address operation circuit, and to output the signal thus selected as an address to be used to write the row address to the row address memory; and a read address setting unit configured to select one from among the memory control signal and the load address generated by the address operation circuit, and to output the signal thus selected as an address to be used to read out the row address from the row address memory.

Also, the pattern generator may further comprise a data setting unit configured to select one from among a row address generated by the address operation circuit and a row address generated according to the program, and to output the row address thus selected as a data signal to be written to the row address memory.

Also, the pattern generator may further comprise an output selection circuit configured to select one from among a row address read out from the row address memory and a row address generated by the address operation circuit.

Another embodiment of the present invention relates to a memory test apparatus. The memory test apparatus comprises a pattern generator according to any one of the aforementioned pattern generators.

Such a test apparatus reduces the burden on the user when programming the pattern program.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
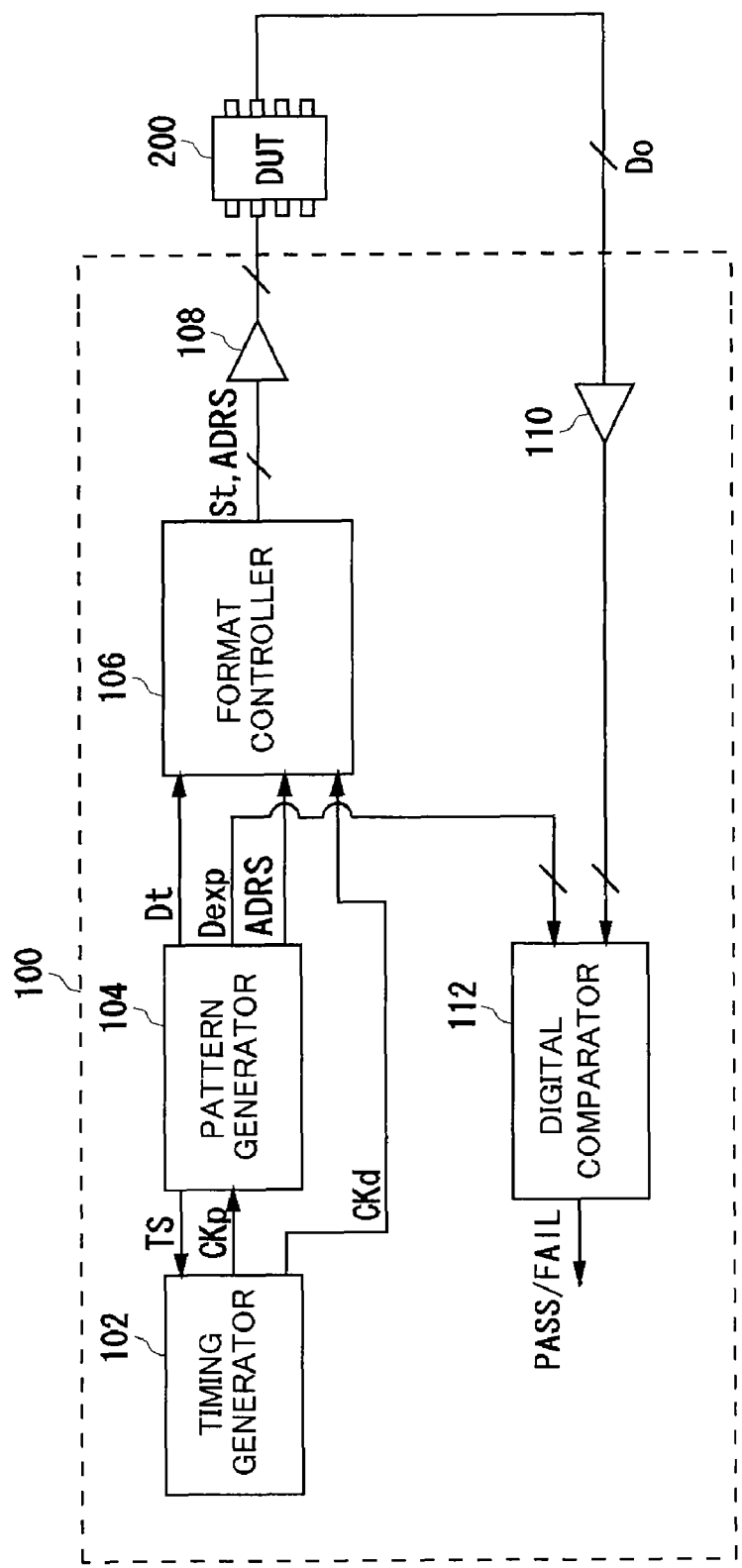
FIG. 1 is a block diagram which shows an overall configuration of a teat apparatus according to an embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

FIG. 1 is a block diagram which shows an overall configuration of a test apparatus 100 according to an embodiment. The test apparatus 100 has a function of judging the quality of a DUT 200, or a function of identifying a defect. Description will be made regarding an arrangement in which the DUT 200 is configured as memory (RAM) having a multi-bank configuration, and has a burst transmission function.

The test apparatus 100 includes a timing generator 102, a pattern generator 104, a format controller 106, a write driver 108, a comparator 110, and a digital comparator 112.

The pattern generator 104 generates a timing set signal (which will be referred to as the "TS signal" hereafter), and supplies the timing set signal thus generated to the timing generator 102. The timing generator 102 generates a cycle clock CKp and a delayed clock CKd according to the timing data specified by the TS signal. The timing generator 102 supplies the cycle clock CKp thus generated to the pattern generator 104, and supplies the delayed clock CKd thus generated to the format controller 106. Subsequently, the pattern generator 104 generates an address signal ADRS that indicates each of the blocks, which are the multiple storage regions included in the DUT 200, and multiple test pattern data Dt to be written to the multiple blocks. The pattern generator 104 supplies the address signal ADRS and the test pattern data Dt thus generated to the format controller 106.

The format controller 106 generates a test pattern signal St that corresponds to the test pattern data Dt thus generated by the pattern generator 104, based upon the delayed clock CKd supplied from the timing generator 102. Subsequently, the format controller 106 supplies the address signal ADRS thus supplied from the pattern generator 104 and the test pattern signal St thus generated to the DUT 200 via the write driver 108.

Furthermore, the pattern generator 104 generates expected value data Dexp beforehand, which is output data to be output from the DUT 200 according to the address signal ADRS and the test pattern signal St. The pattern generator 104 supplies the expected value data Dexp thus generated to the digital comparator 112.

The comparator 110 reads out data Do from a cell of the DUT 200 according to the address signal ADRS, and outputs the data Do thus read out to the digital comparator 112. The digital comparator 112 compares the data Do read out from the DUT 200 with the expected value data Dexp supplied from the pattern generator 104, thereby judging the quality of the DUT 200.

Description will be made regarding accessing the multi-bank configuration DRAM DUT 200. In a case of accessing such multi-bank configuration DRAM, a bank address BA, which is used to designate the target bank, and a row address, which is designated for each bank, are applied to the memory. Subsequently, in addition, a column address is applied to the memory. In this stage, a cell to be accessed is identified, and data access is performed.

In a case in which the test apparatus 100 tests such multi-bank configuration DRAM, in some cases, the following operations are executed.

1. The memory is accessed by applying a row address for each bank while sequentially switching the multiple banks.

2. When memory accessing returns to a given bank, the same row address as that used when the bank was previously accessed is applied so as to access the memory.

The row address is generated by the pattern generator 104. However, an operation in which the same row address is repeatedly generated is wasteful. Furthermore, there is a need to access a different bank while executing a burst read operation or a burst write operation for a given bank. Such an arrangement requires two row addresses at the same time. Accordingly, the pattern generator 104 mounts an address save/load circuit configured to save and load a row address that has been once generated. Detailed description will be made below regarding the address save/load circuit according to the embodiment.

The address save/load circuit 2 saves each row address that has been once supplied to a corresponding bank in memory (which will be referred to as the "row address memory"). The address save/load circuit 2 has a function of loading this row address the next time the same row address in the same bank is accessed. The test apparatus accesses the DUT 200 using the address thus loaded by the address save/load circuit 2.

Figure 2:
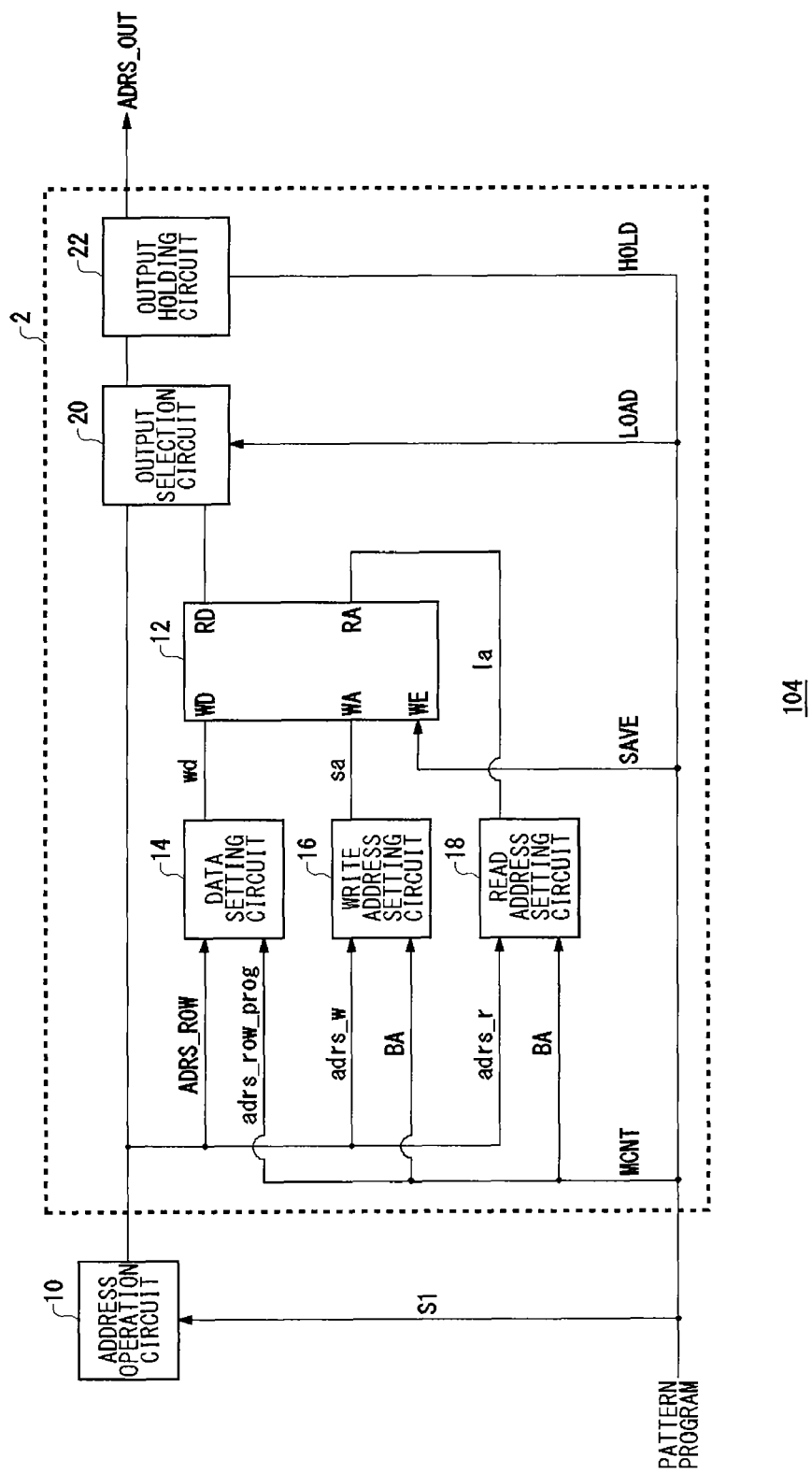
FIG. 2 is a block diagram which shows a part of the configuration of a pattern generator including an address save/load circuit.

FIG. 2 is a block diagram which shows a part of the configuration of the pattern generator 104 including the address save/load circuit 2. The pattern generator 104 includes an address operation circuit 10 and the address save/load circuit 2. Furthermore, in this drawing, command and control signals, which are generated by a pattern program configured to control the test operation, are shown.

The address operation circuit 10 generates an address signal that indicates the target address in the memory, i.e., the DUT 200, according to a control signal S that corresponds to the pattern program. The address signal is applied to the DUT 200 via an output selection circuit 20 and an output holding circuit 22 described later. Alternatively, the address signal thus generated is temporarily held by the address save/load circuit 2, following which the address signal thus held is applied to the DUT 200.

The address operation circuit 10 has, as a main function, a function of generating the row address ADRS_ROW and the column address ADRS_COL for the DUT 200. In addition, the address operation circuit 10 generates a read address adrs_r and a write address adrs_w for row address memory 12 described later. These signals are also collectively referred to simply as the "address signal" hereafter.

It should be noted that the bank address BA to be used to designate the target bank of the DUT 200 is not generated by the address operation circuit 10. The bank address signal BA is generated as a control signal (which will be referred to as the "memory control signal MCNT" hereafter) generated according to the pattern program.

In addition, it should be noted that various kinds of command and control signals generated according to the pattern program must be generated for each cycle of the program. In other words, such various kinds of command and control signals thus generated according to the pattern program do not endure beyond their own cycle. That is to say, when a given command signal or a given control signal is generated in a given cycle according to the pattern program, that command signal or that control signal is invalid in a subsequent cycle. In a case in which a given control signal is to be maintained as the same value, there is a need to code the same function over consecutive cycles in the programming.

The address save/load circuit 2 includes row address memory 12, a data setting circuit 14, a write address setting circuit 16, a read address setting circuit 18, an output selection circuit 20, and an output holding circuit 22.

The row address memory 12 stores, in increments of banks of the DUT 200, the row addresses ADRS_ROW generated by the address operation circuit 10. For example, in a case in which the DUT 200 has a four-bank configuration, the row addresses ADRS_ROW1 through ADRS_ROW4 for the first bank BANK1 through the fourth bank BANK4 are stored at the first address #1 through the fourth address #4, respectively, in the row address memory 12.

The row address memory 12 has a typical configuration including a write data terminal WD, a write address terminal WA, a write enable terminal WE, a read data terminal RD, and a read address terminal RA.

The data setting circuit 14 sets data wd to be supplied to the write data terminal WD of the row address memory 12. Specifically, the data setting circuit 14 receives the row address ADRS_ROW generated by the address operation circuit 10, and uses the row address ADRS_ROW thus generated as the write data wd to be output to the write data terminal WD.

Furthermore, the data setting circuit 14 receives, as a input signal, the row address adrs_row_prog generated according to the pattern program. The data setting circuit 14 is capable of selecting the row address adrs_row_prog generated by the pattern program instead of the row address ADRS_ROW generated by the address operation circuit 10, and of applying the row address thus selected to the write data terminal WD of the row address memory 12.

As described above, the bank address BA, which is used to designate the target bank of the DUT 200, is generated as a memory control signal MCNT according to the pattern program. The memory control signal MCNT including the bank address BA is input to the write address setting circuit 16 and the read address setting circuit 18.

Before the row address ADRS_ROW is saved in the row address memory 12, the write address setting circuit 16 receives the memory control signal MCNT including the bank address BA, and sets the address (which will be referred to as the "save address" hereafter) sa to be supplied to the write address terminal WA of the row address memory 12. In general, the memory control signal MCNT should be used without change as the save address sa. Alternatively, predetermined bits selected from the memory control signal MCNT should be used as the save address sa. That is to say, the write address setting circuit 16 selects the bits to be used as the save address sa, from among the multiple bits of the memory control signal MCNT.

Furthermore, the write address adrs_w generated by the address operation circuit 10 is input to the write address setting circuit 16. Also, the write address setting circuit 16 is capable of selecting the write address adrs_w instead of the memory control signal MCNT, and of applying the write address adrs_w thus selected to the write address terminal WA of the row address memory.

Before the row address ADRS_ROW is loaded from the row address memory 12, the read address setting circuit 18 receives the memory control signal MCNT including the bank address BA, and sets the address la (which will be referred to as the "load address" hereafter) to be supplied to the read address terminal RA of the row address memory 12.

Furthermore, a read address adrs_r generated by the address operation circuit 10 is input to the read address setting circuit 18. Also, the read address setting circuit 18 has a function of selecting the read address adrs_r instead of the memory control signal MCNT, and of applying the read address adrs_r thus selected to the read address terminal RA of the row address memory 12.

A save command signal SAVE, which is generated according to the pattern program, is input to the row address memory 12 via the write enable terminal WE. When the save command signal SAVE is asserted, the data input to the write data terminal WD is written to a region that corresponds to the save address signal sa.

Moreover, the row address memory 12 outputs, via the read data terminal RD, data that corresponds to the load address la applied to the read address terminal RA.

The output selection circuit 20 receives the row address generated by the address operation circuit 10 and the row address output from the read data terminal RD of the row address memory 12. When a load command signal LOAD generated according to the pattern program is asserted, the output selection circuit 20 selects the row address output from the read data terminal RD of the row address memory 12. When the load command signal LOAD is negated, the output selection circuit 20 selects the address signal output from the address operation circuit 10.

The output holding circuit 22 receives a hold command signal HOLD which is generated according to the pattern program. The hold command signal HOLD includes data used to set the number of cycles for which the output holding circuit 22 holds the input signal. In a case in which a burst reading operation test is performed for the DUT 200, the number of cycles is set according to the burst length.

The above is the configuration of the pattern generator 104. Next, description will be made regarding the operation of the pattern generator 104.

For ease of understanding, description will be made regarding a case in which memory access is performed for the DUT 200 according the following procedure.

Step 1: Row address ADRS_ROW1 in the first bank BANK1 is accessed.

Step 2: Row address ADRS_ROW2 in the second bank BANK2 is accessed.

Step 3: Row address ADRS_ROW3 in the third bank BANK3 is accessed.

Step 4: Row address ADRS_ROW4 in the fourth bank BANK4 is accessed.

Step 5: Row address ADRS_ROW1 in the first bank BANK1 is accessed again.

Processing in Step 1

According to the pattern program, the memory control signal MCNT is generated, which includes the bank address BA that designates the first bank BANK1 to be accessed. Furthermore, the address operation circuit 10 generates the row address ADRS_ROW1 and the column address ADRS_COL that designate the address in the DUT 200 to be accessed. The test apparatus 100 accesses the DUT 200 using the bank address BA included in the memory control signal MCNT and the addresses ADRS_ROW1 and ADRS_COL.

Furthermore, the data setting circuit 14 selects the row address ADRS_ROW1 generated by the address operation circuit 10, and supplies the row address ADRS_ROW1 thus selected to the write data terminal WD of the row address memory 12. The write address setting circuit 16 receives the memory control signal MCNT including the bank address BA, and sets the save address sa according to the bank address BA. Specifically, the write address setting circuit 16 generates the save address sa (=#1) based upon the bank address BA which designates the first bank BANK1.

When the save command signal SAVE is asserted according to the pattern program, the row address ADRS_ROW1 is saved at the address #1 in the row address memory 12.

The same processing as that in Step 1 is repeatedly performed in Step 2 through Step 4. As a result, the row address memory 12 saves the row addresses ADRS_ROW1 through ADRS_ROW4 at the addresses #1 through #4 thereof.

Processing in Step 5.

According to the pattern program, the memory control signal MCNT is generated, which includes the bank address BA which designates the first bank BANK1. The read address setting circuit 18 receives the memory control signal MCNT including the bank address BA, and sets the load address la according to the bank address BA. Specifically, the read address setting circuit 18 generates the load address la (=#1) based upon the bank address BA which designates the first bank BANK1, and supplies the load address la thus generated to the read address terminal RA of the row address memory 12. As a result, the row address memory 12 outputs, via the read data terminal RD, the row address ADRS_ROW1 that is saved at the address #1.

When the loading command signal LOAD is asserted according to the pattern program, the row address ADRS_ROW1 is supplied to the DUT 200 via the output holding circuit 22.

The above is the basic operation of the test apparatus 100. By using the pattern generator 104 according to the embodiment, the following effects and advantages are realized.

The pattern generator 104 according to the embodiment uses the memory control signal MCNT including the bank address BA as the save address sa and the load address la to be used to access the row address memory 12. That is to say, such an arrangement allows the user to perform programming without the need for coding with respect to the save address sa and the load address la, thereby reducing the burdens on the programming.

Such an advantage can be more clearly understood based upon the following description.

As a comparison technique, description will be made regarding an arrangement in which the write address setting circuit 16 and the read address setting circuit 18 included in the pattern generator 104 shown in FIG. 2 access the row address memory 12 according to the addresses adrs_w and adrs_r generated by the address operation circuit 10.

With such an arrangement, the address operation circuit 10 generates the appropriate addresses adrs_w and adrs_r. Accordingly, there is a need to code a function for generating an appropriate control signal S1 in the pattern program. Accordingly, the user is forced to perform programming in order to control the address save/load circuit 2, which does not directly relate to the memory access operation for the DUT 200, and this is not user-friendly.

In contrast with such a comparison arrangement, with the embodiment, the bank address BA is also used as the save address sa and the load address la, thereby providing simple programming.

Furthermore, the write address setting circuit 16 and the read address setting circuit 18 are capable of supplying the addresses adrs_w and adrs_r, which are generated by the address operation circuit 10, to the row address memory 12. Thus, such an arrangement allows the user to supply any desired address in addition to the memory control signal MCNT (i.e., bank address BA), thereby enhancing the flexibility of the testing.

Next, description will be made regarding the operation in a case in which the aforementioned Step 1 through Step 5 are executed in testing a burst read operation of the DUT 200.

In the Step 1 through Step 4, the same processing as described above is executed.

Processing in Step 5.

The memory control signal MCNT including the bank address BA that designates the first bank BANK1 is generated according to the pattern program. The read address setting circuit 18 receives the memory control signal MCNT including the bank address BA, and generates the load address la (=#1) that corresponds to the bank address BA.

In the state in which the load address la is set, a number of cycles that corresponds to the burst length is set for the hold command signal HOLD by means of the pattern program, and the load command signal LOAD is asserted. This enables the row address ADRS_ROW1 saved at the address #1 to be supplied to the DUT 200 via the output holding circuit 22 for the period of the number of cycles thus set.

When the load command signal LOAD is asserted, the output selection circuit 20 selects the row address loaded from the row address memory 12. When the load command signal LOAD is negated, the output selection circuit 20 selects the row address generated by the address operation circuit 10. If the output holding circuit 22 were not provided, there would be a need to assert the load command signal LOAD at intervals of each cycle in the burst transmission operation. Accordingly, there would be a need to code a load command for each cycle in the pattern program, leading to a problem of the program becoming complicated. In particular, for the burst length to be configurable as multiple burst lengths, the coding of a program to support such burst lengths would be very troublesome. In contrast, with such an arrangement employing the address save/load circuit 2 according to the embodiment, by providing the output holding circuit 22, a load command and a hold command need only be coded once, before the initial burst transmission function. Thus, such an arrangement provides simplified coding.

Description has been made regarding the present invention using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A pattern generator employed in a test apparatus configured to test memory under test having a multi-bank configuration, the pattern generator comprising:
   an address operation circuit configured to generate a row address which indicates an address in the memory under test to be accessed; and
   row address memory configured to store the row addresses generated by the address operation circuit in increments of banks,
   wherein a memory control signal which includes a bank address to be applied to the memory under test, and which is generated according to a program, is used as a save address used to write the row address to the row address memory, and as a load address used to read out the row address from the row address memory.

2. A pattern generator according to claim 1, further comprising an output holding circuit configured to receive a control signal generated according to the program in order to set a burst length used on accessing the memory, and to hold the row address read out from the row address memory during a period that corresponds to the burst length.

3. A pattern generator according to claim 1, wherein the address operation circuit is configured so as to be capable of generating a save address and a load address to be used for the row address memory, in addition to the row address,
   and wherein the pattern generator further comprises:
      a write address setting unit configured to select one from among the memory control signal and the save address generated by the address operation circuit, and to output the signal thus selected as an address to be used to write the row address to the row address memory; and
      a read address setting unit configured to select one from among the memory control signal and the load address generated by the address operation circuit, and to output the signal thus selected as an address to be used to read out the row address from the row address memory.

4. A pattern generator according to claim 1, wherein the pattern generator further comprises a data setting unit configured to select one from among a row address generated by the address operation circuit and a row address generated according to the program, and to output the row address thus selected as a data signal to be written to the row address memory.

5. A pattern generator according to claim 1, further comprising an output selection circuit configured to select one from among a row address read out from the row address memory and a row address generated by the address operation circuit.

6. A memory test apparatus comprising a pattern generator configured to test memory under test having a multi-bank configuration, the pattern generator comprising:
   an address operation configured to generate a row address which indicates an address in the memory under test to be accessed; and
   row address memory configured to store the row addresses generated by the address operation circuit in increments of banks,
   wherein a memory control signal which includes a bank address to be applied to the memory under test, and which is generated according to a program, is used as a save address used to write the row address to the row address memory, and as a load address used to read out the row address from the row address memory.

7. A pattern generator according to claim 2, wherein the address operation circuit is configured so as to be capable of generating a save address and a load address to be used for the row address memory, in addition to the row address,
   and wherein the pattern generator further comprises:
      a write address setting unit configured to select one from among the memory control signal and the save address generated by the address operation circuit, and to output the signal thus selected as an address to be used to write the row address to the row address memory; and
      a read address setting unit configured to select one from among the memory control signal and the load address generated by the address operation circuit, and to output the signal thus selected as an address to be used to read out the row address from the row address memory.

8. A pattern generator according to claim 2, wherein the pattern generator further comprises a data setting unit configured to select one from among a row address generated by the address operation circuit and a row address generated according to the program, and to output the row address thus selected as a data signal to be written to the row address memory.

9. A pattern generator according to claim 2, further comprising an output selection circuit configured to select one from among a row address read out from the row address memory and a row address generated by the address operation circuit.

10. A memory test apparatus according to claim 6, further comprising an output holding circuit configured to receive a control signal generated according to the program in order to set a burst length used on accessing the memory, and to hold the row address read out from the row address memory during a period that correspond to the burst length.

* * * * *